United States Patent
Ozaki et al.

(10) Patent No.: US 6,838,807 B2
(45) Date of Patent: Jan. 4, 2005

(54) SURFACE ACOUSTIC WAVE DEVICE SUITABLE FOR USE IN GHZ BAND

(75) Inventors: Kyosuke Ozaki, Niigata-ken (JP); Satoshi Waga, Niigata-ken (JP); Haruhiko Fujimoto, Niigata-ken (JP); Takashi Sato, Niigata-ken (JP); Yutaka Matsuo, Fukushima-ken (JP); Takeshi Ikeda, Niigata-ken (JP); Kazuaki Kaneko, Niigata-ken (JP); Takuo Kudo, Niigata-ken (JP)

(73) Assignee: Alps Electric Co., Ltd., Tokyo (JP)

( * ) Notice: Subject to any disclaimer, the term of this patent is extended or adjusted under 35 U.S.C. 154(b) by 0 days.

(21) Appl. No.: 10/701,831

(22) Filed: Nov. 5, 2003

(65) Prior Publication Data

US 2004/0180632 A1 Sep. 16, 2004

(30) Foreign Application Priority Data

Nov. 12, 2002 (JP) ......................... 2002-327982

(51) Int. Cl.[7] ............................ H01L 41/08; H03H 9/145
(52) U.S. Cl. .................................................. 310/313 D
(58) Field of Search ................ 310/364, 313 A–313 D; 333/193–195

(56) References Cited

U.S. PATENT DOCUMENTS

| | | | | |
|---|---|---|---|---|
| 5,296,824 A | * | 3/1994 | Cho et al. ............... | 310/313 D |
| 5,315,432 A | * | 5/1994 | Ohno ........................ | 359/326 |
| 5,359,452 A | * | 10/1994 | Nitanda et al. ............ | 359/328 |
| 6,172,582 B1 | * | 1/2001 | Hickernell .............. | 310/313 D |
| 6,407,486 B1 | * | 6/2002 | Kimura et al. .......... | 310/313 A |
| 6,677,696 B1 | * | 1/2004 | Ruile ..................... | 310/313 A |

FOREIGN PATENT DOCUMENTS

| | | |
|---|---|---|
| JP | 2001-251157 | 9/2001 |
| JP | 2002-26685 | 1/2002 |

* cited by examiner

*Primary Examiner*—Thomas M. Dougherty
*Assistant Examiner*—Karen Beth Addison
(74) *Attorney, Agent, or Firm*—Brinks Hofer Gilson & Lione

(57) ABSTRACT

IDT electrodes are formed by a Cu alloy. When the wavelength of a SAW propagating in the direction of the X axis of a piezoelectric substrate is indicated by $\lambda$, and when the thickness of the IDT electrodes is indicated by H, the standardized thickness $H/\lambda$ of the IDT electrodes ranges from 0.045 to 0.070, and the piezoelectric substrate is a rotated Y-cut $LiTaO_3$ substrate whose rotational cut angle $\theta$ from the Y axis to the Z axis around the X axis ranges from 52.0° to 58.0°. With this arrangement, the reflection coefficient S11 becomes 0.88 or higher.

3 Claims, 4 Drawing Sheets

SURFACE ACOUSTIC WAVE DEVICE SUITABLE FOR USE IN GHZ BAND

BACKGROUND OF THE INVENTION

1. Field of the Invention

The present invention relates to surface acoustic wave (SAW) devices exhibiting improved resonance characteristics in a high frequency band.

2. Description of the Related Art

SAW devices are electronic components formed by utilizing SAWs that propagate by allowing mechanical vibration energy thereof to concentrate only on and near the surfaces of solids. SAW devices form filters, resonators, duplexers, etc.

As mobile communication terminals, for example, cellular telephones, are rapidly becoming smaller and lighter, small electronic components installed in such mobile communication terminals are also demanded.

The typical configuration of SAW devices is as follows. A pair of comb-like electrodes (hereinafter also referred to as interdigital transducer electrodes (IDT electrodes)) made of a conductive material having a small specific gravity are disposed on the surface of a piezoelectric substrate such that they face each other while the comb-like portions of the pair of IDT electrodes are interdigitated with each other. SAW devices having such a simple configuration are very suitable for reducing the size of filters, resonators, and duplexers installed in mobile communication terminals.

In known SAW devices, as a material for the piezoelectric substrate exhibiting a high excitation efficiency and a small SAW insertion loss in a high frequency band, a $LiTaO_3$ monocrystal-line 36°-rotated X-propagating Y-cut plate is used.

When the SAW frequency is a few hundred megahertz or lower, SAW devices formed by piezoelectric substrates made of $LiTaO_3$ monocrystal-line 36°-rotated Y-cut plates exhibit a high excitation efficiency and a small SAW propagation loss.

However, SAW devices formed by piezoelectric substrates made of the above-described type of plate are not necessarily suitable in the GHz band, which is now commonly used in, for example, cellular telephones.

Japanese Unexamined Patent Application Publication No. 2001-251157 (page 4, FIGS. 7 and 8, page 5, FIG. 12, and page 6) discloses the following SAW device. In operating in the GHz band, when the thickness of the electrodes is increased, the apparent electromechanical coupling coefficient is enhanced so as to achieve a filter with a wider band. On the other hand, bulk waves radiating from the electrodes to the inside of the substrate are intensified, thereby disadvantageously increasing the SAW propagation loss. That is, when operating in the GHz band, the advantages obtained by increasing the mass of the electrodes are noticeable.

The above publication also discloses that, to achieve the above-described advantages, the cut angle θ of the $LiTaO_3$ monocrystal, which is used as the material for the piezoelectric substrate, is set to be larger than 36°, and more specifically, 39° to 46°, in order to minimize the propagation loss of the SAW device.

As a material for IDT electrodes of known SAW devices, Al or an alloy essentially consisting of Al, which exhibits conductive characteristics and has a small specific gravity, is generally used.

A high resistance to power is required for a SAW device used for an antenna duplexer of a radio frequency (RF) unit disposed at a stage subsequent to a transmission amplifier since high power is applied to the antenna duplexer. Additionally, as the frequency used in mobile communication terminals is increasing, it is demanded that the operation frequency of SAW devices be raised from a few hundred megahertz to a few gigahertz.

Accordingly, instead of forming IDT electrodes by Al or an alloy essentially consisting of Al, the use of Cu or an alloy essentially consisting of Cu has been suggested.

For example, Japanese Unexamined Patent Application Publication No. 2002-26685 (page 3, FIG. 1) discloses that IDT electrodes of SAW devices are formed of Cu or an alloy essentially consisting of Cu, which exhibits low electrical resistance and high resistance to stress migration.

However, only FIG. 8 and the corresponding paragraphs [0035] and [0036] of the specification of Japanese Unexamined Patent Application Publication No. 2001-251157 disclose that a SAW device was actually formed, and then, the relationships between the minimum insertion loss and the cut angle θ of the $LiTaO_3$ monocrystal, which is used as the material for the piezoelectric substrate, were examined. The results were obtained by using the SAW filter shown in FIG. 7 of that publication when the film thickness of the IDT electrodes was set to be about 0.4 μm, which corresponds to 10% of the wavelength of SAWs to be excited.

In this publication, the relationship between the electrode thickness and the insertion loss of the SAW filter is indicated in FIG. 12 and the corresponding paragraphs [0046] and [0047] of the specification. However, the results shown in FIG. 12 are merely calculated values of the insertion loss assuming that the IDT electrodes are formed of Al or an Al(99%)-Cu(1%) alloy, and they are not based on an actual experiment.

Paragraph [0050] of this publication also discloses a preferable range of the electrode thickness when the IDT electrodes are formed of Cu. However, this publication neither discloses experimental values nor calculated values which can be a basis of this thickness range.

Accordingly, when forming a SAW device by using a $LiTaO_3$ monocrystal as the material for a piezoelectric substrate and by using Cu or a Cu alloy as the material for the electrodes, the exact relationship between the cut angle θ of the $LiTaO_3$ monocrystal and the electrode thickness for obtaining excellent characteristics of the SAW device has not been determined.

SUMMARY OF THE INVENTION

Accordingly, in order to solve the above-described problems, it is an object of the present invention to provide a SAW device including a piezoelectric substrate formed of a $LiTaO_3$ monocrystal having a predetermined cut angle and electrodes having a predetermined standardized thickness, such predetermined values being specified by actually forming a SAW device and by measuring the resonance characteristics of the SAW device, so as to improve the resonance characteristics in the GHz band while suppressing the insertion loss.

In order to achieve the above object, the present invention provides a SAW device including: a piezoelectric substrate; an electrode unit for exciting a SAW on a surface of the piezoelectric substrate; and reflectors for reflecting the SAW at the reflectors. The electrode unit includes IDT electrodes including a thin-film layer formed of copper or a copper alloy, and a connecting electrode connected to each of the IDT electrodes. When the wavelength of the SAW is indicated by λ, and when the thickness of the IDT electrodes is indicated by H, the standardized thickness H/λ of the IDT electrodes ranges from 0.045 to 0.070, and the piezoelectric substrate is a rotated Y-cut LiTaO$_3$ substrate whose cut angle θ from the Y axis to the Z axis around the X axis ranges from 52.0° to 58.0°. The SAW propagates in the direction of the X axis of the piezoelectric substrate.

In the present invention, the standardized thickness H/λ of the IDT electrodes and the rotational cut angle θ of the piezoelectric substrate are determined based on the reflection coefficient S11 of the SAW device.

The reflection coefficient S11 is determined by the ratio of the reflection voltage to the incident voltage when a signal is applied between a signal input electrode and a ground electrode of a SAW resonator. The reflection coefficient S11 becomes 1 at the antiresonant frequency in an ideal resonator. This means that the impedance becomes infinite at the antiresonant frequency, and thus, the Q factor of the resonator becomes infinite. Accordingly, as the reflection coefficient S11 becomes closer to 1, the resulting resonator exhibits excellent characteristics.

More specifically, the standardized thickness H/λ of the IDT electrodes and the rotational cut angle θ of the piezoelectric substrate was determined so that the reflection coefficient S11 becomes 0.88 or higher when a signal at the antiresonant frequency is input into the SAW device, thereby specifying the SAW device of the present invention.

According to the SAW device of the present invention, superior resonance characteristics for GHz-band high-frequency signals can be reliably exhibited. Thus, by using the SAW device of the present invention, a filter exhibiting sharp attenuation characteristics can be formed.

In the SAW device of the present invention, the IDT electrodes are formed by using Cu or a Cu alloy. Accordingly, even by forming the IDT electrodes highly integrated, the resistance is not increased so as to achieve a small insertion loss of the filter, and even with an increased stress in accordance with a higher frequency, the migration of the Cu atoms is suppressed, thereby improving the resistance of the SAW device to stress migration.

Since the standardized thickness H/λ is set to be large, i.e., ranging from 0.045 to 0.070, the resistance in the IDT electrodes can be small, and the insertion loss of the SAW device can be suppressed.

In the present invention, the standardized thickness H/λ of the IDT electrodes may range from 0.050 to 0.065, and the piezoelectric substrate may be a rotated Y-cut LiTaO$_3$ substrate whose cut angle θ from the Y axis to the Z axis around the X axis ranges from 52.4° to 58.0°. With this arrangement, the reflection coefficient S11 exhibits 0.90 or higher when a signal at the antiresonant frequency is input, and thus, a SAW device exhibiting better resonance characteristics for GHz-band high-frequency signals can be obtained.

The present invention also provides a SAW device including: a piezoelectric substrate; an electrode unit for exciting a SAW on a surface of the piezoelectric substrate; and reflectors for reflecting the SAW at the reflectors. The electrode unit includes IDT electrodes including a thin-film layer formed of copper or a copper alloy, and a connecting electrode connected to each of the IDT electrodes. When the wavelength of the SAW is indicated by λ, and when the thickness of the IDT electrodes is indicated by H, the standardized thickness H/λ of the IDT electrodes ranges from 0.050 to 0.065, and the piezoelectric substrate is a rotated Y-cut LiTaO$_3$ substrate whose cut angle θ from the Y axis to the Z axis around the X axis ranges from 50.0° to 59.5°. The SAW propagates in the direction of the X axis of the piezoelectric substrate. In this case, the reflection coefficient S11 when a signal at the antiresonant frequency is input can also exhibit 0.88 or higher.

DESCRIPTION OF THE PREFERRED EMBODIMENTS

The present invention is described in detail below with reference to the accompanying drawings through illustration of a preferred embodiment.

Figure 1:
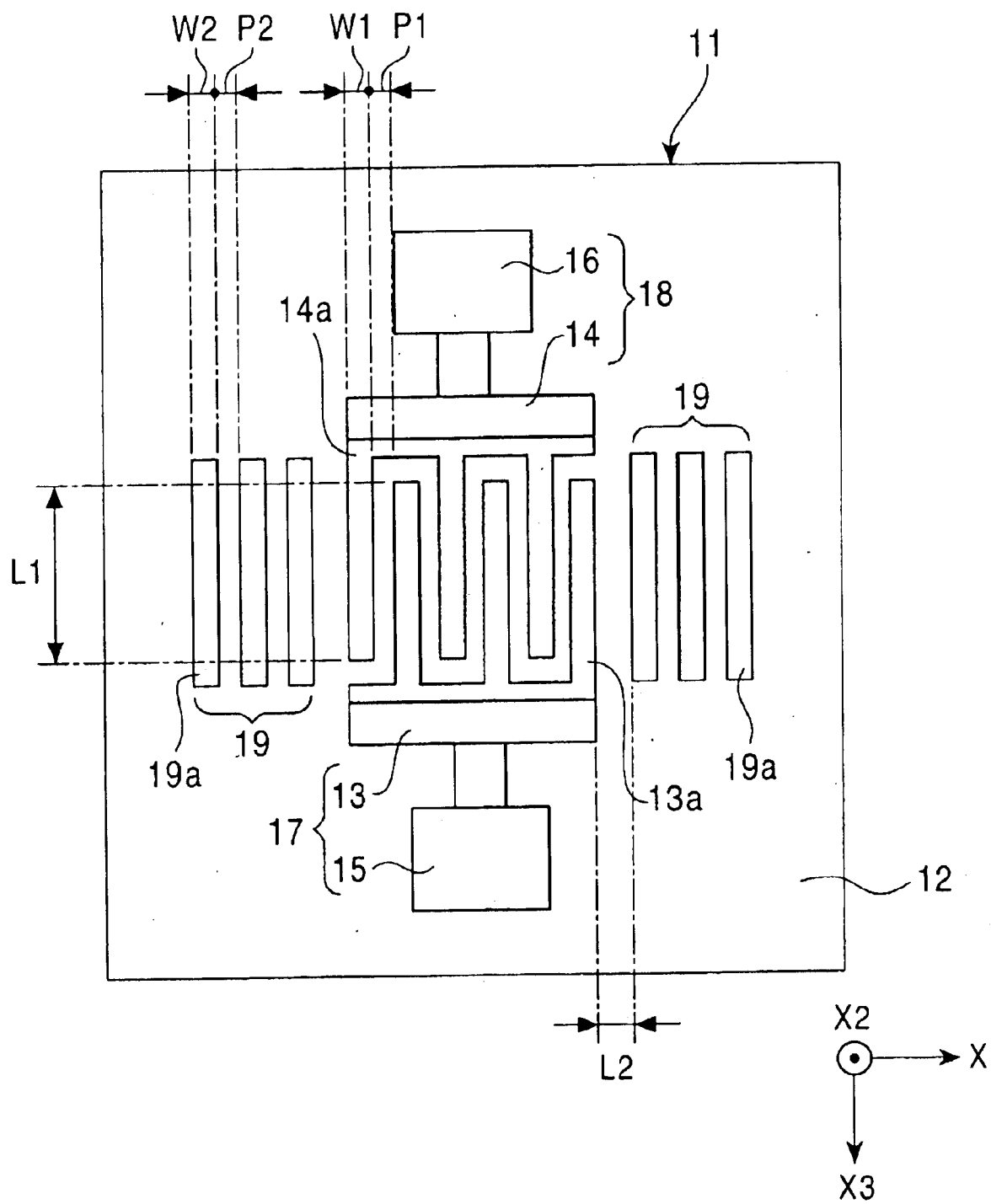
FIG. 1 is a plan view illustrating a SAW device according to an embodiment of the present invention.

FIG. 1 is a plan view illustrating a SAW device 11, which serves as a resonator, according to an embodiment of the present invention.

A piezoelectric substrate 12 is formed of LiTaO$_3$. IDT electrodes 13 and 14 are formed on the piezoelectric substrate 12. The IDT electrode 13 is provided with a comb-like portion 13a extending in the direction opposite to the direction indicated by X3 in FIG. 1, and the IDT electrode 14 is provided with a comb-like portion 14a extending in the X3 direction. The comb-like portions 13a and 14a are interdigitated with each other with a predetermined pitch therebetween longitudinally in the X direction in FIG. 1.

Connecting electrodes 15 and 16 for connecting the SAW device with external circuits are electrically connected to the IDT electrodes 13 and 14, respectively.

The IDT electrode 13 and the connecting electrode 15 form an electrode unit 17, and the IDT electrode 14 and the connecting electrode 16 form an electrode unit 18.

In the embodiment shown in FIG. 1, the comb-like portions 13a and 14a have the same width W1 and a constant pitch P1. The comb-like portions 13a and 14a are interdigitated with each other by a length (hereinafter referred to as the "interdigital length") L1. The width W1 ranges from 0.1 μm to 1.5 μm, the pitch P1 ranges from 0.1 μm to 1.5 μm, and the length L1 ranges from 16 μm to 100 μm.

In this embodiment, the IDT electrodes 13 and 14 are formed of Cu or a Cu alloy, which is an alloy containing small amounts of Ag, Sn, or C in Cu. The content of Ag, Sn, or C should be in a range so that the specific gravity of the resulting Cu alloy is almost equal to that of pure Cu. More specifically, when the weight percents of the elements added to the Cu alloy range from 0.5 to 10.0, the specific gravity of the resulting Cu alloy becomes almost equal to that of pure Cu.

Reflectors 19, 19 having a plurality of rectangular electrodes (slips) 19a in the X direction are formed adjacent to the IDT electrodes 13 and 14 in the X direction and the direction opposite to the X direction with a predetermined distance therebetween. In FIG. 1, the ends of the electrodes forming the reflectors 19, 19 are open, though they may be short-circuited.

The connecting electrodes 15 and 16 and the reflectors 19, 19 may be formed of the same material as that for the IDT electrodes 13 and 14, or they may be formed of another conductive material, such as Au.

The IDT electrodes 13 and 14, the connecting electrodes 15 and 16, and the reflectors 19, 19 are formed by a thin-film forming process, for example, sputtering or deposition, and a patterning process using resist photolithography. An underlayer film made of, for example, Ti, may be formed under the IDT electrodes 13 and 14 and the reflectors 19, 19. Additionally, an oxidation-resistive protective layer made of, for example, Cr, may be formed on the IDT electrodes 13 and 14 and the reflectors 19, 19.

One of the connecting electrodes 15 and 16 of the SAW device 11 is grounded, and a high frequency signal is input into the other connecting electrode 15 or 16, and SAWs are excited on the surface of the piezoelectric substrate 12 and propagate in the X direction and the direction opposite to the X direction. The SAWs are then reflected by the reflectors 19, 19 and are returned to the IDT electrodes 13 and 14. The SAW device 11 has a resonant frequency and an antiresonant frequency, and has the maximum impedance at the antiresonant frequency.

Figure 2:
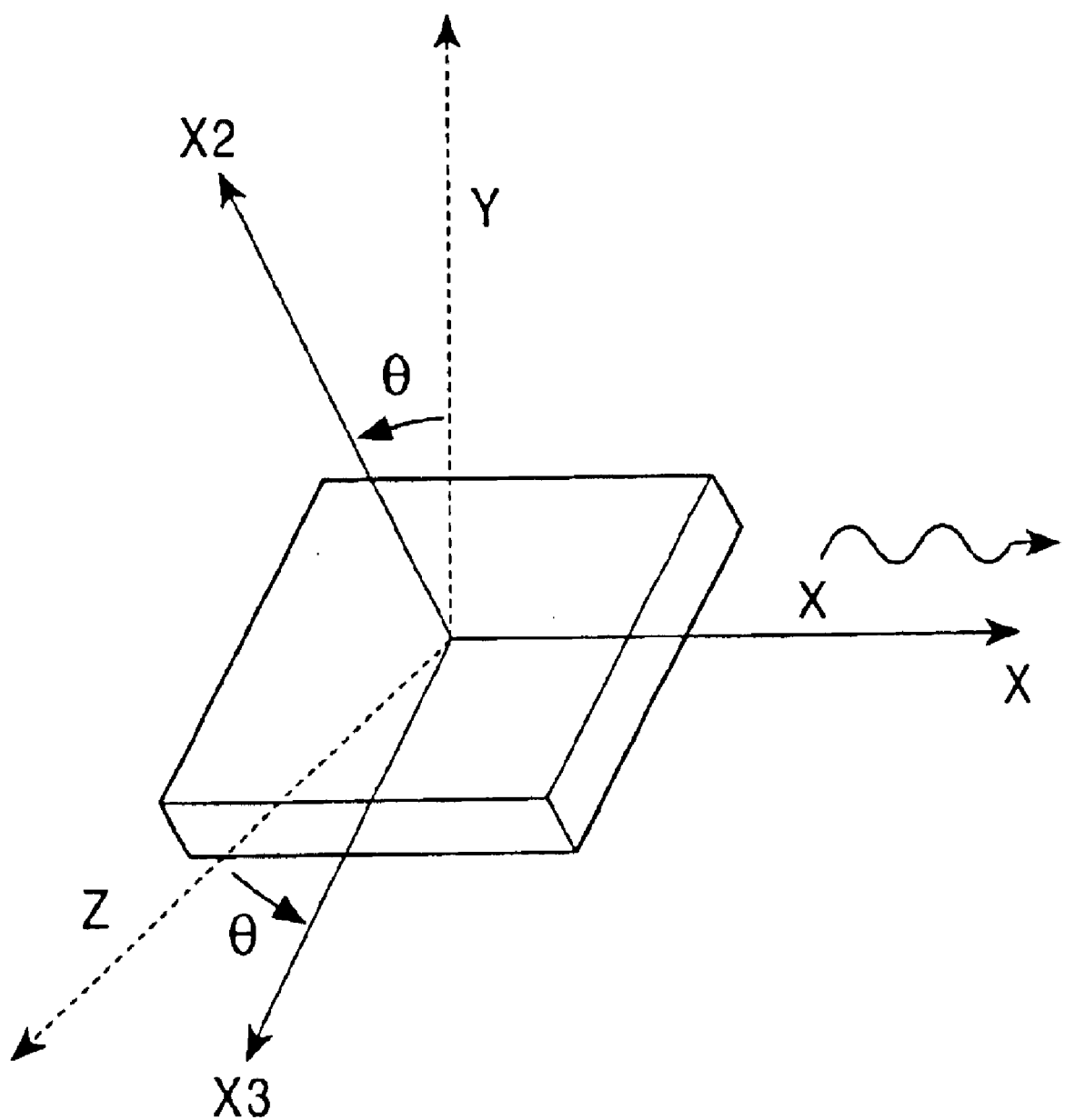
FIG. 2 is a schematic view illustrating the cut angle of a monocrystal piezoelectric substrate.

FIG. 2 illustrates a $LiTaO_3$ monocrystal having crystal axes X, Y, and Z in which the Y axis tilts toward the Z axis by the rotational angle θ around the X axis. Such a piezoelectric substrates is referred to as a "θ-rotated Y-cut $LiTaO_3$ substrate. The angle θ is referred to as the "rotational cut angle" or "cut angle".

In the SAW device of this embodiment, when the wavelength of the SAWs is indicated by λ, and when the thickness of the IDT electrodes is indicated by H, the standardized thickness H/λ of the IDT electrodes ranges from 0.045 to 0.070. The piezoelectric substrate is a rotated Y-cut $LiTaO_3$ substrate whose rotational cut angle θ from the Y axis to the Z axis around the X axis ranges from 52.0° to 58.0°.

As stated above, in a high frequency range, as in the GHz band, the thickness H of the IDT electrodes 13 and 14 considerably influences the wavelength of the SAWs excited on the surface of the piezoelectric substrate 12. That is, the advantages obtained by increasing the mass of the IDT electrodes 13 and 14 are noticeable.

As will be experimentally shown in the subsequent example, when the standardized thickness H/λ of the IDT electrodes 13 and 14 and the rotational cut angle θ of the rotated Y-cut $LiTaO_3$ substrate are within the above-described ranges, the reflection coefficient S11 at the antiresonant frequency of the SAW device 11 becomes 0.88 or higher.

That is, the input impedance of the SAW device 11 at the antiresonant frequency becomes large so as to form a resonator exhibiting a high Q factor and a small attenuation. Accordingly, by using the SAW device 11, a filter having sharp attenuation characteristics can be formed.

In the SAW device of the present invention, the IDT electrodes 13 and 14 are formed by using Cu or a Cu alloy. Accordingly, even by forming the IDT electrodes 13 and 14 highly integrated, the resistance is not increased, and even with an increased stress in accordance with a higher frequency, the migration of the Cu atoms is suppressed, thereby improving the resistance of the SAW device 11 to stress migration.

Since the standardized thickness H/λ becomes large, i.e., ranging from 0.045 to 0.070, the resistance of the IDT electrodes 13 and 14 can be decreased, thereby suppressing the insertion loss of the SAW device 11.

If the standardized thickness H/λ of the IDT electrodes 13 and 14 is set to be 0.050 to 0.065, and if the piezoelectric substrate 12 is a rotated Y-cut $LiTaO_3$ substrate whose rotational cut angle θ is set to be 52.4° to 58.0°, the reflection coefficient S11 becomes 0.90 or higher in response to an input signal at the antiresonant frequency, thereby exhibiting improved resonance characteristics for GHz-band high-frequency signals.

When a SAW device in which SAWs propagate in the direction of the X axis of a piezoelectric substrate is formed by setting the standardized thickness H/λ of the IDT electrodes 13 and 14 to range from 0.050 to 0.065 and by setting the rotational cut angle θ of the piezoelectric substrate 12 to be 50.0° to 59.5°, the reflection coefficient S11 in response to a signal at the antiresonant frequency input into the SAW device becomes 0.88 or higher.

Figure 3:
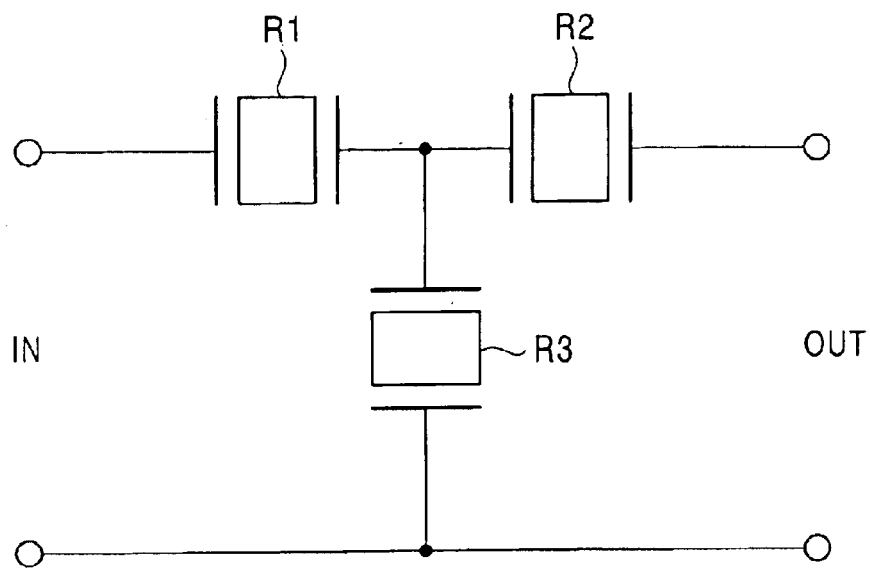
FIG. 3 is an equivalent circuit diagram illustrating a T filter formed by using the SAW device shown in FIG. 1.
Figure 4:
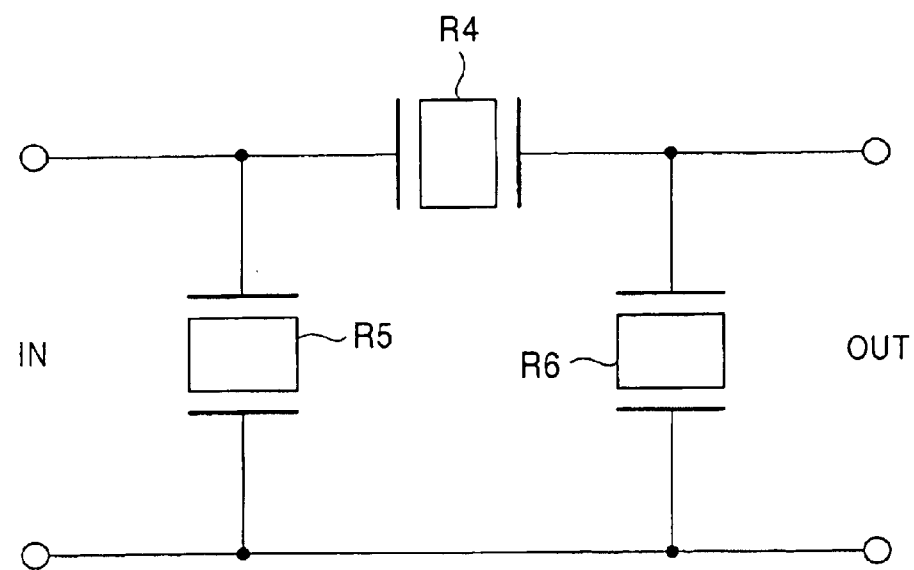
FIG. 4 is an equivalent circuit diagram illustrating a π filter formed by using the SAW device shown in FIG. 1.

FIGS. 3 and 4 illustrate examples of filters formed by using the SAW device 11 shown in FIG. 1.

In FIG. 3, R1, R2, and R3 each indicate one SAW device 11 shown in FIG. 1. The filter shown in FIG. 3 is a so-called "T filter", which is formed by connecting three SAW filters with each other. More specifically, SAW devices R1 and R2 are connected in series with each other via the connecting electrodes of the SAW devices R1 and R2, and one of the connecting electrodes of the SAW device R1 serves as an input terminal IN, and one of the connecting electrodes of the SAW device R2 serves as an output terminal OUT. One of the connecting electrodes of the SAW device R3 is connected between the SAW devices R1 and R2, and the other connecting electrode thereof is grounded.

In FIG. 4, R4, R5, and R6 each indicate one SAW device 11 shown in FIG. 1. The filter shown in FIG. 4 is a so-called π filter. In the filter shown in FIG. 4, SAW devices R5 and R6 are connected in parallel with each other, and a SAW device R4 is inserted between the SAW devices R5 and R6.

More specifically, one of the connecting electrodes of the SAW device R4 serves as an input terminal IN, and the other connecting electrode thereof serves as an output terminal OUT. One of the connecting electrodes of the SAW device R5 is used as the input terminal IN, and the other connecting electrode thereof is grounded. One of the connecting electrodes of the SAW device R6 is used as the output terminal OUT, and the other connecting electrode is grounded.

A specific example of the SAW device is described below. The resonator characteristics of the SAW device of the present invention were evaluated in terms of the reflection coefficient S11.

The reflection coefficient S11 is determined by the ratio of the reflection voltage to the incident voltage when a signal is applied between a signal input electrode and a ground electrode of a SAW resonator. The reflection coefficient S11 becomes 1 at the antiresonant frequency in an ideal resonator. This means that the impedance becomes infinite at the antiresonant frequency, and thus, the Q factor of the resonator becomes infinite. Accordingly, as the reflection coefficient S11 becomes closer to 1, the resulting resonator exhibits excellent characteristics.

In this example, a SAW device having the configuration shown in FIG. 1 was formed, and the relationships of the reflection coefficient S11 of the SAW device to the rotational cut angle θ of a $LiTaO_3$ monocrystal forming the piezoelectric substrate from the Y axis to the Z axis around the X axis and to the standardized thickness H/λ of IDT electrodes were examined.

The conditions in this example were as follows:

The width W1 of each comb-like portion of the IDT electrodes and the width W2 of each strip of the resonators were W1=W2=0.4 μm to 0.545 μm;

The pitch P1 between the comb-like portions of the two IDT electrodes and the pitch P2 between the strips of the reflectors were P1=P2=0.4 μm to 0.545 μm;

The interdigital length L1 between the comb-like portions of the two IDT electrodes was L1=40×(SAW wavelength λ)=40×2×(W1+P1);

The thickness H of the IDT electrodes and each strip of the reflectors was 0.095 μm;

The number of comb-like portions of the IDT electrodes was 200;

The number of strips of the reflectors was 50; and

The distance L2 between the IDT electrode and the corresponding reflector was L2=P1=P2=0.4 μm to 0.545 μm.

As the material for the piezoelectric substrate, $LiTaO_3$ was used. In this example, the input frequency was set to be the antiresonant frequency (1.7 to 2.1 GHz). The IDT electrodes and the reflectors were formed of a Cu(97%)-Ag (3%) alloy.

Figure 5:
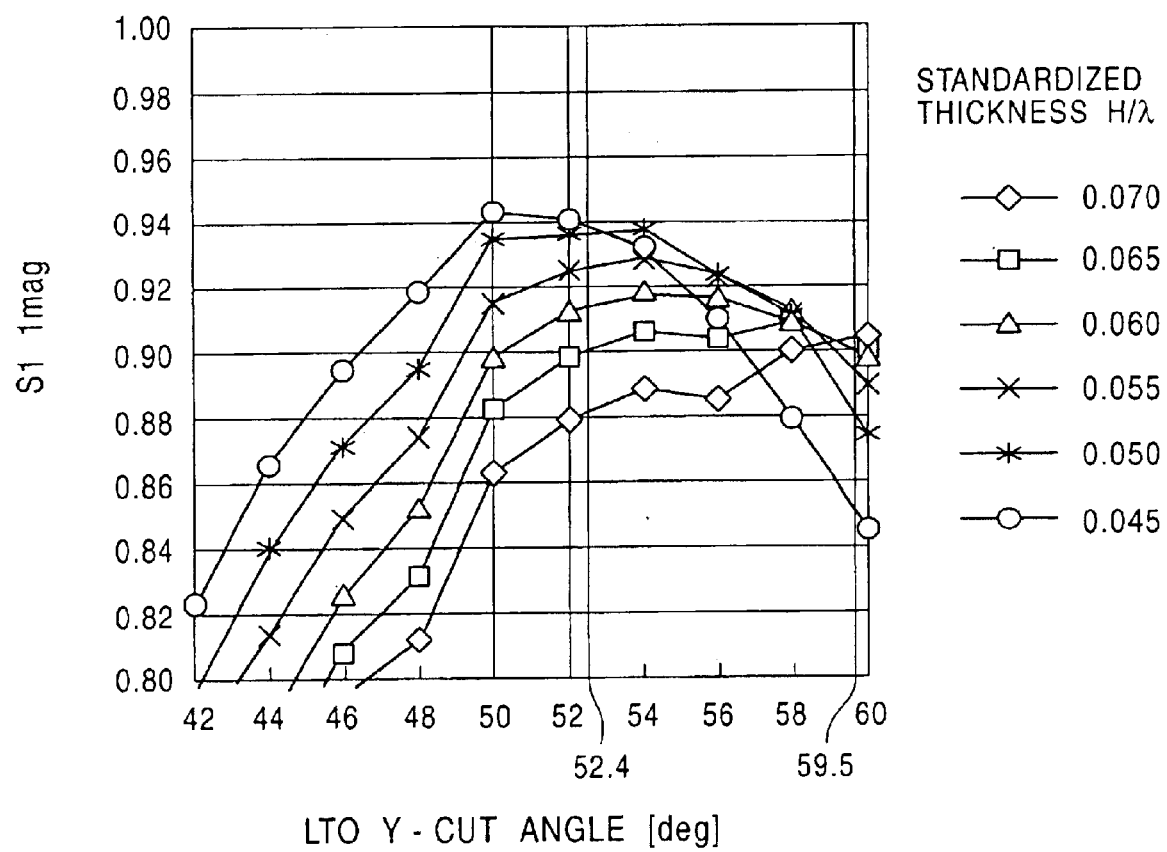
FIG. 5 is a graph illustrating the relationships of the reflection coefficient S11 of the SAW device to the cut angle θ of the piezoelectric substrate and to the standardized thickness H/λ of the IDT electrodes.

The results are shown in FIG. 5. FIG. 5 shows that the reflection coefficient S11 at the antiresonant frequency becomes 0.88 or higher when the standardized thickness H/λ of the IDT electrodes ranges from 0.045 to 0.070 and when the cut angle of the $LaTiO_3$ monocrystal forming the piezoelectric substrate ranges from 52.0° to 58.0°.

That is, the impedance at the antiresonant frequency becomes large so as to form a resonator having a high Q factor. As a result, a filter having sharp attenuation characteristics can be formed.

FIG. 5 also shows that the reflection coefficient S11 at the antiresonant frequency becomes 0.90 or higher when the standardized thickness H/λ of the IDT electrodes ranges from 0.050 to 0.065 and when the cut angle of the $LaTiO_3$ monocrystal forming the piezoelectric substrate ranges from 52.4° to 58.0°, thereby exhibiting better resonance characteristics for GHz-band high-frequency signals.

Alternatively, when the standardized thickness H/λ of the IDT electrodes ranges from 0.050 to 0.065 and when the cut angle of the $LaTiO_3$ monocrystal forming the piezoelectric substrate ranges from 50.0° to 59.5°, the reflection coefficient S11 at the antiresonant frequency becomes 0.88 or higher.

As described above, in the present invention, by setting the cut angle of the $LiTaO_3$ monocrystal, which is used as the material for the piezoelectric substrate, to be larger than the value used as a suitable cut angle disclosed in Japanese Unexamined Patent Application Publication No. 2001-251157, the standardized thickness H/λ of the IDT electrodes can be increased to 0.045 or larger. As a result, the insertion loss of the SAW device can be decreased, and the reflection coefficient S11 can be increased to 0.88 or higher so as to improve the resonance characteristics.

Accordingly, the SAW device of the present invention reliably exhibits superior resonance characteristics for GHz-band high-frequency signals, thereby making it possible to form a filter having sharp attenuation characteristics.

The above-described preferred embodiment and preferred example are examples only and are not intended to limit the scope of the invention, and various modifications and changes may be made to the invention without departing from the spirit of the invention.

What is claimed is:

1. A surface acoustic wave device comprising:

a piezoelectric substrate;

an electrode unit for exciting a surface acoustic wave on a surface of said piezoelectric substrate; and reflectors for reflecting the surface acoustic wave at said reflectors, wherein:

said electrode unit comprises interdigital electrodes including a thin-film layer formed of copper or a copper alloy, and a connecting electrode connected to each of the interdigital electrodes; and when a wavelength of the surface acoustic wave is indicated by λ, and when a thickness of the interdigital electrodes is indicated by H, a standardized thickness H/λ of the interdigital electrodes ranges from 0.045 to 0.070, and said piezoelectric substrate is a rotated Y-cut $LiTaO_3$ substrate whose cut angle θ from a Y axis to an Z axis around an X axis ranges from 52.0° to 58.0°, the surface acoustic wave propagating in a direction of the X axis of said piezoelectric substrate.

2. A surface acoustic wave device according to claim 1, wherein the standardized thickness H/λ of the interdigital electrodes ranges from 0.050 to 0.065, and said piezoelectric substrate is a rotated Y-cut $LiTaO_3$ substrate whose cut angle θ from the Y axis to the Z axis around the X axis ranges from 52.4° to 58.0°.

3. A surface acoustic wave device comprising:

a piezoelectric substrate;

an electrode unit for exciting a surface acoustic wave on a surface of said piezoelectric substrate; and reflectors for reflecting the surface acoustic wave at said reflectors, wherein:

said electrode unit comprises an interdigital electrodes including a thin-film layer formed of copper or a copper alloy, and a connecting electrode connected to each of the interdigital electrodes; and when a wavelength of the surface acoustic wave is indicated by λ, and when a thickness of the interdigital electrodes is indicated by H, a standardized thickness H/λ of the interdigital electrodes ranges from 0.050 to 0.065, and said piezoelectric substrate is a rotated Y-cut $LiTaO_3$ substrate whose cut angle θ from a Y axis to a Z axis around an X axis ranges from 50.0° to 59.5°, the surface acoustic wave propagating in a direction of the X axis of said piezoelectric substrate.

* * * * *